United States Patent [19]

Ahn

[11] Patent Number: 5,563,080
[45] Date of Patent: Oct. 8, 1996

[54] METHOD OF MANUFACTURING A HIGH VOLTAGE TRANSISTOR IN A SEMICONDUCTOR DEVICE

[75] Inventor: Byung J. Ahn, Seoul, Rep. of Korea

[73] Assignee: Hyundai Electronics Industries Co., Ltd., Kyungki-Do, Rep. of Korea

[21] Appl. No.: 478,753

[22] Filed: Jun. 7, 1995

[30] Foreign Application Priority Data

Jun. 15, 1994 [KR] Rep. of Korea ............... 94-13501

[51] Int. Cl.⁶ .................. H01L 21/336; H01L 21/033
[52] U.S. Cl. ................... 437/41; 437/228; 437/80; 437/984; 148/DIG. 143
[58] Field of Search .......... 437/41 GS, 41 SM, 437/41 RG, 69, 80, 984, 228 S, 228 O, 41; 148/DIG. 143; 257/401

[56] References Cited

U.S. PATENT DOCUMENTS

| | | | |
|---|---|---|---|
| 3,861,024 | 1/1975 | Napili et al. | 437/228 |
| 3,958,040 | 5/1976 | Webb | 437/228 |
| 3,980,508 | 9/1976 | Takamiya et al. | 437/228 |
| 4,242,156 | 12/1980 | Peel | 437/80 |
| 4,313,256 | 2/1982 | Widmann | 437/80 |
| 4,667,395 | 5/1987 | Ahlgren et al. | 437/228 |
| 5,132,238 | 7/1992 | Murakami et al. | 437/41 |
| 5,200,351 | 4/1993 | Hadijizadeh-Amini. | |

*Primary Examiner*—George Fourson
*Assistant Examiner*—Scott Kirkpatrick
*Attorney, Agent, or Firm*—Fish & Richardson P.C.

[57] ABSTRACT

The present invention discloses a structure of a transistor in a semiconductor device and a method of manufacturing the same. The present invention manufactures a high voltage transistor by etching a silicon substrate to a depth deeper than that of the field oxide film by a self-aligned wet etching process using the field oxide film as a mask and, thereafter, by forming the first gate electrode which electrically switches ON and OFF between the source region and the drain region by using a gate electrode mask and simultaneously forming a second gate electrode to prevent a junction breakdown below the bird's beak of the field oxide film. Accordingly, the present invention can improve the degree of integration of the device by forming a gate electrode to prevent a junction breakdown below the bird's beak of the field oxide film.

1 Claim, 4 Drawing Sheets

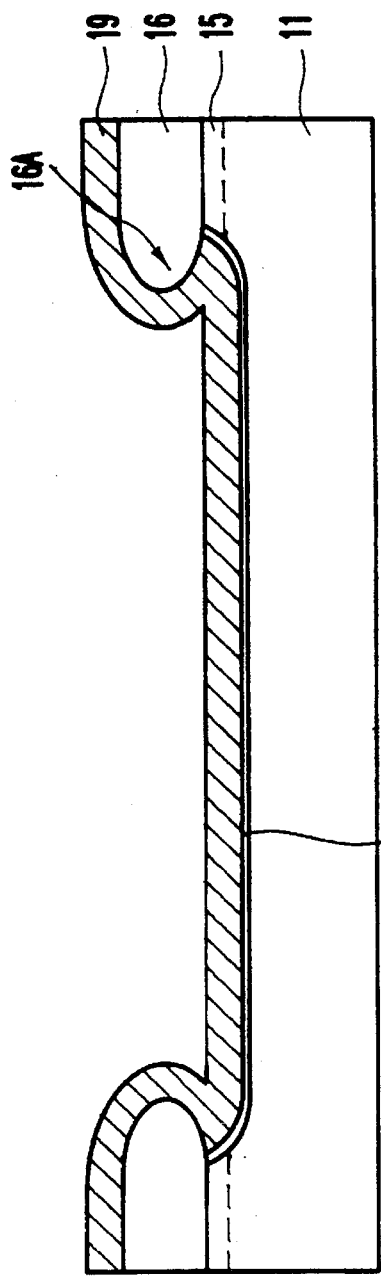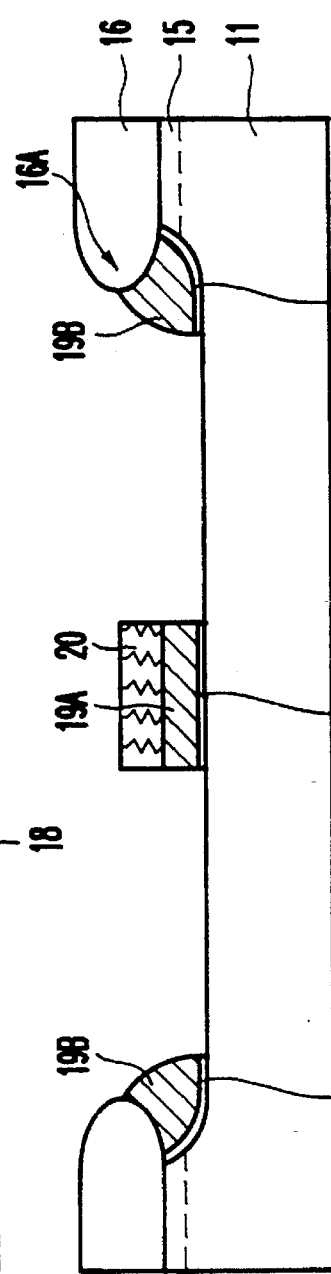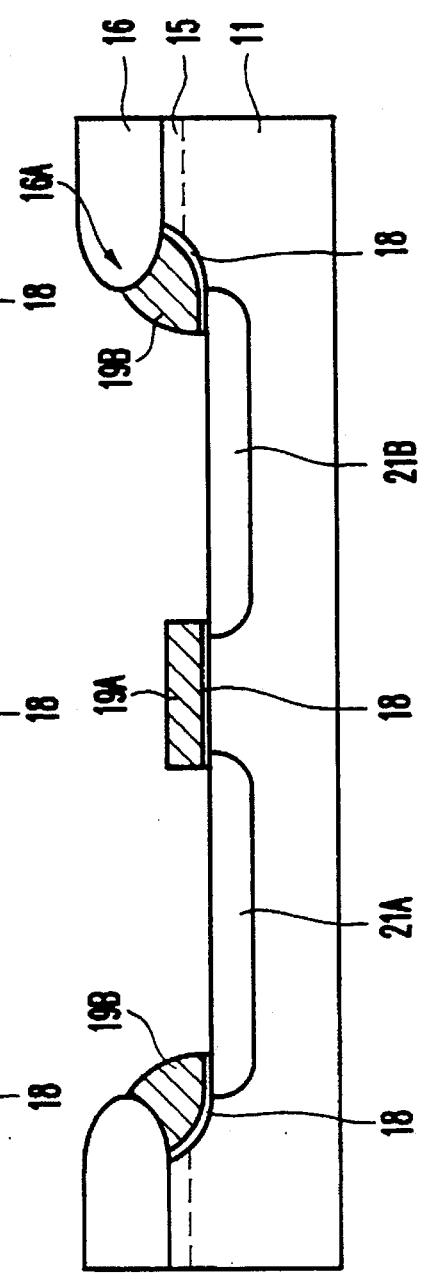

METHOD OF MANUFACTURING A HIGH VOLTAGE TRANSISTOR IN A SEMICONDUCTOR DEVICE

BACKGROUND OF INVENTION

1. Field of the Invention

The present invention relates to a structure of a high voltage transistor in a semiconductor device and a method of manufacturing the same and, more particularly to a structure of a high voltage transistor in a semiconductor device and a method of manufacturing the same to embody a bootstrap circuit and a flash EEPROM which utilize high voltage.

2. Information Disclosure Statement

Conventional high voltage transistors are classified according to whether they are transistors with a source and drain formed in a DDD (Double Diffused Drain) structure or dough-net type transistors.

FIG. 1 is a sectional view of a conventional dough-net type high voltage transistor and FIG. 2 is a layout of FIG. 1.

Referring to FIGS. 1 and 2, a channel stop region 2 is formed by implanting ion on a silicon substrate 1 on which a field oxide film 3 is to be formed to prevent a parasitic field transistor from causing a malfunction. The field oxide film 3 is formed by LOCOS (Local Oxidation of Silicon) isolation method. First and second gate electrodes 5A and 5B are formed by depositing polysilicon and by etching the polysilicon utilizing a gate electrode mask. The first gate electrode 5A located between a source region 6A and a drain region 6B. The second gate electrode 5B which is formed on a section of the silicon substrate 1 and on a section of the field oxide film 3 along the edge of the field oxide film 3 is connected to the first gate electrode 5A. The second gate electrode 5B functions to prevent a junction breakdown. The source and drain regions 6A and 6B are formed by ion implantation after forming the first and second gate electrodes 5A and 5B. The gate oxide film 4 electrically insulates the silicon substrate 1 from the first and second gate electrodes 5A and 5B. A load oxide film 7 is formed on the entire upper part of the device including on the first and second gate electrodes 5A and 5B to protect the device. As a final step in manufacturing the high voltage transistor, a metal wiring 8 is formed.

In general, the gate oxide film of the high voltage transistor is thick, and in a transistor having a thick gate oxide film as such, the concentration of the channel stop region is relatively higher than that of the channel surface. Thereby, a junction breakdown occurs between the source(or drain) region and the channel stop region. Therefore, a dough-net type transistor can better solve the problem due to the channel stop region of high concentration in comparison with the source and drain region in the conventional simple DDD structure so as to increase the junction breakdown voltage. However, in a VLSI process in which many transistors are arrayed, the second gate electrode 5B must be additionally formed to prevent the junction breakdown between the channel stop region 2 and the source region 6A (or drain region 6B). In adding such second gate electrode 5B, a problem arises with integrating the device. The amount of space taken up by the device is increased because of the area required to form the second gate electrode 5B. Similarly, with transistors in which the source and drain are formed in DDD structure, the relatively large lateral diffusion create a problem with integrating the device.

SUMMARY OF THE INVENTION

The object of the present invention is to provide a structure of a high voltage transistor in a semiconductor device and a method of manufacturing the same which improves the degree of device integration by forming a gate electrode under a bird's beak of the field oxide film.

The structure of the high voltage transistor in the present invention can be characterized as follows. A first gate electrode is formed on a silicon substrate, which is recessed to a depth deeper than that of the field oxide film, by an etching process utilizing a gate electrode mask, and a second gate electrode which is connected to the first gate electrode is formed along the edge of the field oxide film below a bird's beak of the field oxide film.

The method of manufacturing a high voltage transistor to achieve the object of the present invention comprises the steps of: forming a channel stop region in a field region and, thereafter, forming a field oxide film on the channel stop region; forming a recess by etching an exposed portion of the silicon substrate to a depth deeper than that of the field oxide film by a wet etching process utilizing the field oxide film as an etching mask; sequentially forming a gate oxide film and a polysilicon layer on the entire upper portion including the recess and, thereafter, forming a first gate electrode by an etching process using a gate electrode mask and simultaneously forming a second gate electrode in the form of a spacer below a bird's beak of the field oxide film; and forming a source and drain region on the silicon substrate between the first gate electrode and the second gate electrode.

BRIEF DESCRIPTION OF THE DRAWINGS

FIG. 3A through FIG. 3G are sectional views illustrating the steps of manufacturing a high voltage transistor in the present invention.

Similar reference characters refer to similar parts through the several views of the drawings.

DETAILED DESCRIPTION OF THE INVENTION

Figure 1:
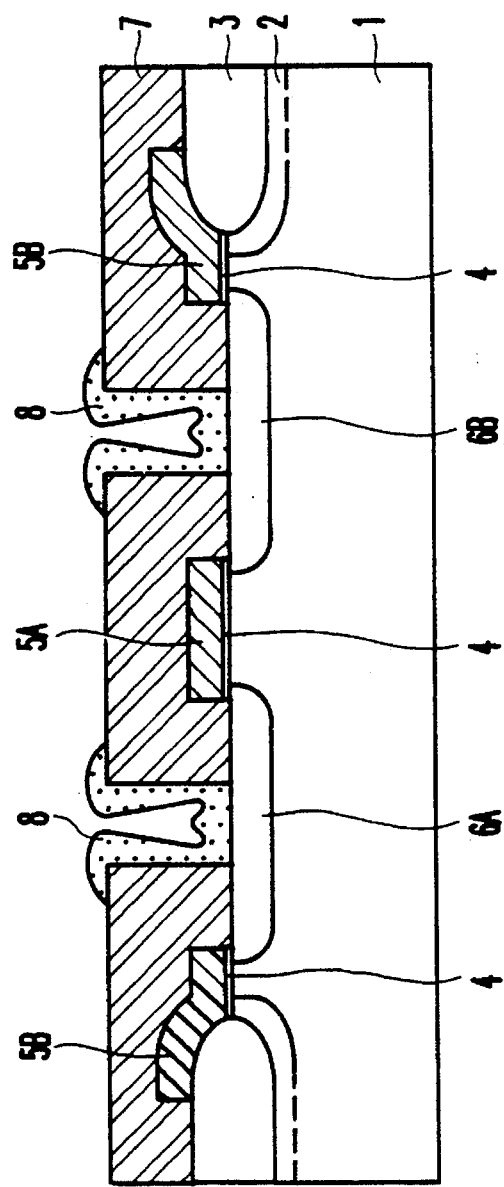
FIG. 1 is a sectional view of a conventional dough-net type high voltage transistor.
Figure 2:
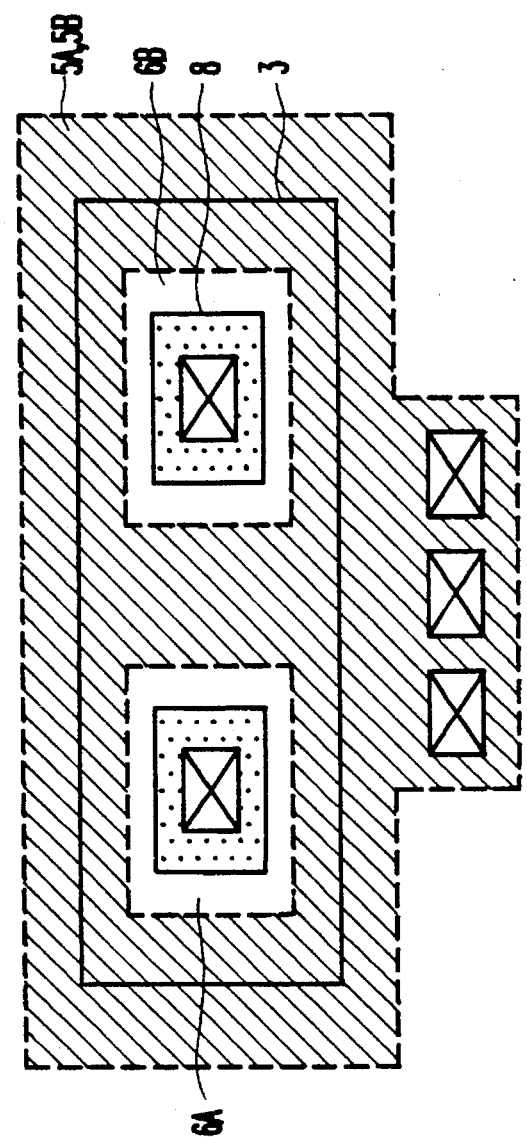
FIG. 2 is a layout of a conventional dough-net type high voltage transistor.

FIGS. 1 and 2 are a sectional view and a layout, respectively, of a conventional dough-net type high voltage transistor and are discussed above.

FIG. 3A through FIG. 3G are sectional views illustrating the steps of manufacturing a high voltage transistor in the present invention.

Figure 3A:
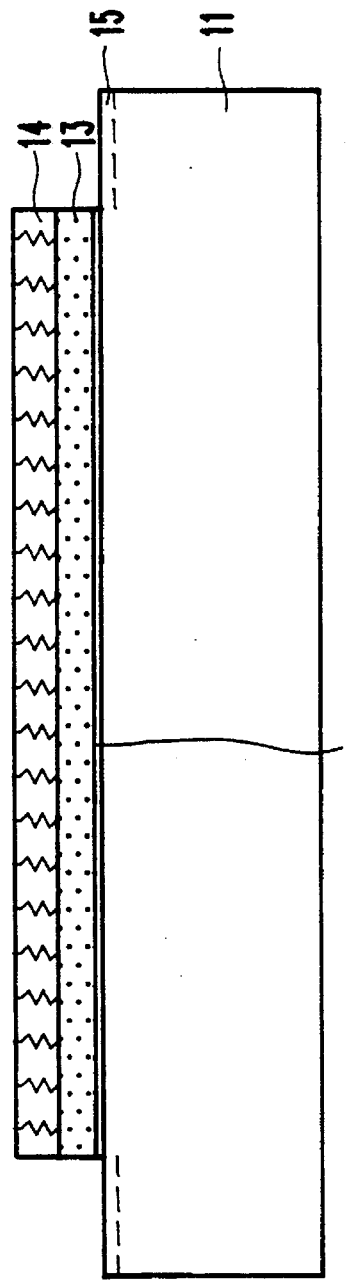

Referring to FIG. 3A, a pad oxide film 12 and nitride film 13 are sequentially formed on a silicon substrate 11. A first photoresist pattern 14 is formed on the nitride film 13 by a lithography process using a device isolation mask. The nitride film 13 and pad oxide film 12 are sequentially etched by using the first photoresist pattern 14 as an etching mask, thereby exposing the silicon substrate 11 of the field region. Thereafter, a channel stop region 15 is formed on the silicon substrate 11 of the field region by implanting ion, to prevent malfunction caused by a parasitic field transistor.

Figure 3B:
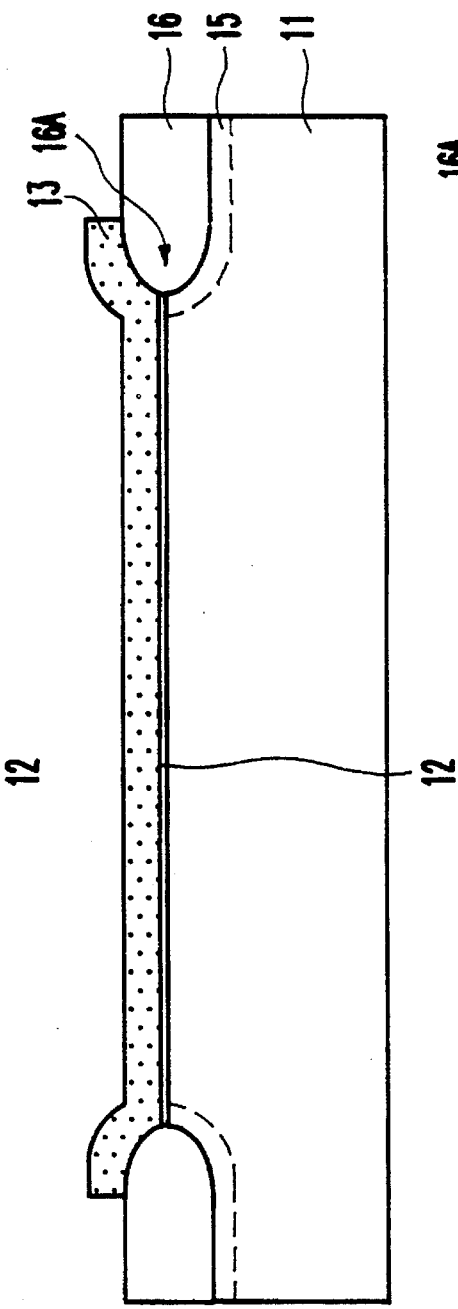

Referring to FIG. 3B, the first photoresist pattern 14 is removed. A field oxide film 16 is formed on the silicon substrate 11 of the channel stop region 15 by the local oxidation of silicon(LOCOS). At this time, a bird's beak 16A is created at the edge of the field oxide film 16.

Figure 3C:
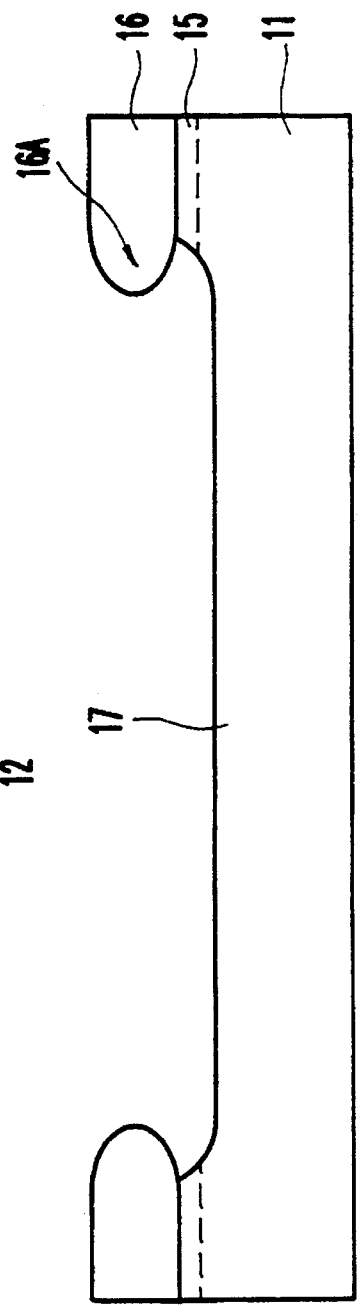

Referring to FIG. 3C, the nitride film 13 and the pad oxide film 12 which remain on the silicon substrate 11 of the active region are removed by a wet etching process. Thereafter, the exposed portion of the silicon substrate 11 is etched to a designated depth by a self-aligned wet etching process using the field oxide film 16 as an etching mask, to form a recess 17. The recess 17 is formed to protrude below the bird's beak 16A.

Referring to FIG. 3D, a gate oxide film 18 is formed on the silicon substrate 11 of the recess 17 structure. A polysilicon layer 19 is formed on the gate oxide film 18 and the field oxide film 16.

Referring to FIG. 3E, a second photoresist pattern 20 is formed on the polysilicon layer 19 by a lithography process using a gate electrode mask. A first and second gate electrodes 19A and 19B are formed by etching the polysilicon layer 19 using the second photoresist pattern 20 as an etching mask.

Figure 4:
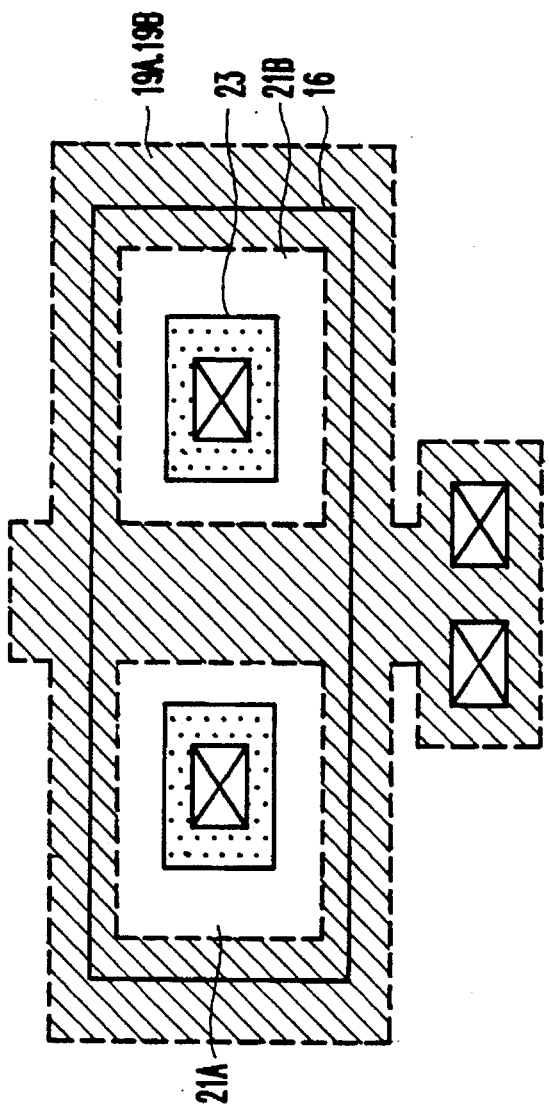
FIG. 4 is a layout of the high voltage transistor in the present invention.

In the above process, the first and second gate electrodes 19A and 19B are formed to connect with each other as shown in FIG. 4. The first gate electrode 19A is determined by the second photoresist pattern 20 and switches electrically ON and OFF between the source region and drain region. The second gate electrode 19B is formed in the form of a spacer below the bird's beak 16A.

Referring to FIG. 3F, the second photoresist pattern 20 is removed. A source region 21A and drain region 21B are formed on the silicon substrate 11 between the first gate electrode 19A and the second gate electrode 19B by implanting ion.

Figure 3G:
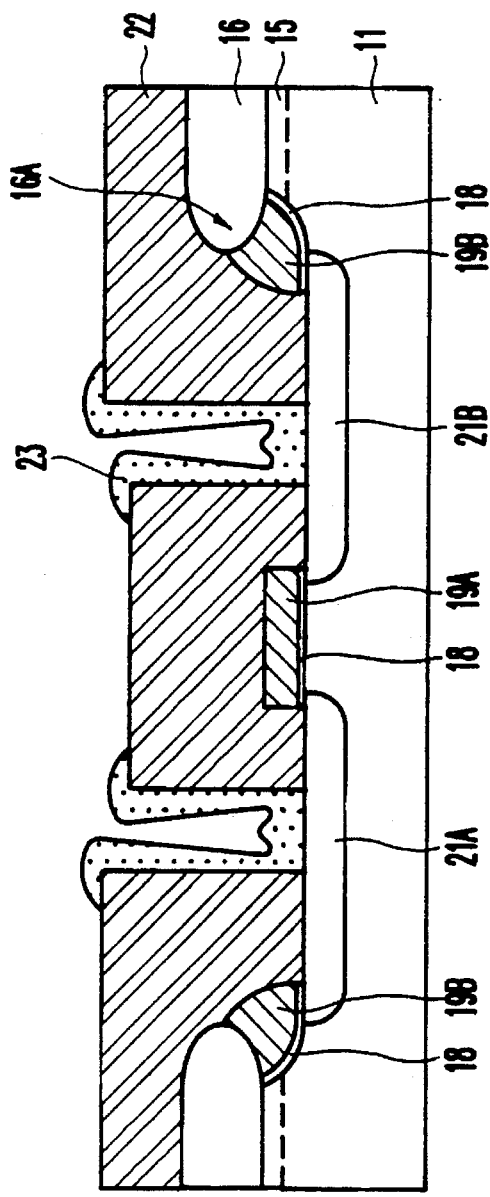

Referring to FIG. 3G, a load oxide film 22 is formed on the entire upper portion including the first and second gate electrodes 19A and 19B to protect the device. As a final step in the manufacture of a high voltage transistor, a metal wiring 23 is formed.

FIG. 4 is a layout of the high voltage transistor in the present invention shown in FIG. 3G.

The present invention manufactures a high voltage transistor by etching a silicon substrate to a depth deeper than that of the field oxide film by a self-aligned wet etching process using the field oxide film as a mask and, thereafter, by forming the first gate electrode which electrically switches ON and OFF between the source region and the drain region by a process utilizing a gate electrode mask and simultaneously forming the second gate electrode below the bird's beak of the field oxide film to prevent a junction breakdown.

Therefore, the present invention can improve the degree of integration of the device by forming a gate electrode below the bird's beak of the field oxide film to prevent a junction breakdown.

Although this invention has been described in its preferred embodiment with a certain degree of particularity, one skilled in the art should realize that the preferred embodiment disclosed here is only an example and that the construction, combination and arrangement of its parts may be varied without departing from the spirit and scope of the invention.

What is claimed is:

1. A method of manufacturing a high voltage transistor in a semiconductor substrate comprising the steps of:

forming a channel stop region in a field region and, thereafter, forming a field oxide film on said channel stop region;

forming a recess by etching an exposed portion of said silicon substrate to a depth deeper than that of said field oxide film by a wet etching process using said field oxide film as an etching mask;

sequentially forming a gate oxide film and a polysilicon layer on the entire resulting exposed surface of the semiconductor substrate including said recess and, thereafter, forming a first gate electrode by an etching process using a gate electrode mask and simultaneously forming a second gate electrode connected to said first gate electrode in the form of a spacer below a bird's beak of said field oxide film; and forming a source and drain region on said silicon substrate between said first and second gate electrodes.

* * * * *